United States Patent
Bredesen et al.

[11] Patent Number: 6,086,729
[45] Date of Patent: Jul. 11, 2000

[54] METHOD OF MANUFACTURING THIN METAL MEMBRANES

[75] Inventors: Rune Bredesen, Oslo; Hallgeir Klette, Skulestadmo, both of Norway

[73] Assignee: Sintef, Trondheim, Norway

[21] Appl. No.: 09/171,439

[22] PCT Filed: Apr. 25, 1997

[86] PCT No.: PCT/NO97/00109

§ 371 Date: Oct. 20, 1998

§ 102(e) Date: Oct. 20, 1998

[87] PCT Pub. No.: WO97/40914

PCT Pub. Date: Nov. 6, 1997

[30] Foreign Application Priority Data

Apr. 30, 1996 [NO] Norway .................................. 96.1739

[51] Int. Cl.[7] .................................................. C23C 14/34
[52] U.S. Cl. .............................. 204/192.15; 204/192.12; 204/298.23; 204/298.26
[58] Field of Search ................................ 427/250, 251, 427/255.5, 255.7; 204/192.12, 192.15, 298.24, 298.26, 298.23; 419/3; 164/46

[56] References Cited

U.S. PATENT DOCUMENTS

| | | |
|---|---|---|
| 2,171,599 | 9/1939 | Reid ........................................ 164/46 |
| 3,270,381 | 9/1966 | Smith . |
| 4,699,637 | 10/1987 | Iniotakis et al. . |
| 4,857,080 | 8/1989 | Baker et al. . |
| 4,898,623 | 2/1990 | Pinkhasov . |
| 5,139,541 | 8/1992 | Edlund . |
| 5,217,506 | 6/1993 | Edlund et al. . |
| 5,259,870 | 11/1993 | Edlund . |
| 5,382,344 | 1/1995 | Hosokawa et al. . |
| 5,393,325 | 2/1995 | Edlund . |
| 5,409,782 | 4/1995 | Murayama . |
| 5,498,278 | 3/1996 | Edlund . |

OTHER PUBLICATIONS

Dr. Rob Dye, Applying thin-film technology to advance membranes, Membrane Technology No.68, pp. 3–4.

*Primary Examiner*—Nam Nguyen
*Assistant Examiner*—Gregg Cantelmo
*Attorney, Agent, or Firm*—Duane, Morris & Heckscher

[57] ABSTRACT

Method for manufacturing a composite membrane structure comprising a thin metal membrane, for example of silver, palladium or palladium alloys, for use in selective diffusion of gasses. The metal material for the membrane is applied by sputtering as a coating on a base member having a low surface roughness, to a desired thickness of the resulting coating. The coating is pulled off from the base member so as to form the metal membrane, and the metal membrane is placed on a supporting substrate.

21 Claims, 1 Drawing Sheet

METHOD OF MANUFACTURING THIN METAL MEMBRANES

FIELD OF THE INVENTION

The invention relates to a method for manufacturing very thin metal membranes being free of defects and suitable for use in gas separation. This type of gas separation takes place by selective diffusion through the specifically manufactured membranes, which can consist of various metals, but in this connection membranes of palladium or palladium alloys are of particular interest.

BACKGROUND OF THE INVENTION

Metal membranes for this purpose can lie on a supporting substrate that shall provide for mechanical strength in the composite membrane structure. The invention is particularly directed to manufacturing such a composite membrane structure for use in gas separation by selective diffusion and comprising a metal membrane manufactured on the basis of a method according to the invention.

A number of metals possess perm-selectivity (selective permeability) with respect to various gases. Therefore they can be employed as selective membranes in gas separation. Well known examples of such selective properties are oxygen diffusion in silver and hydrogen diffusion in palladium alloys. A prerequisite for perm-selectivity is that there are no defects in these metal membranes in the form of through holes and cracks that can provide for transport of all types of gases through the membrane by common gas diffusion in the defects.

In order to obtain as high (selective) permeability as possible in the membrane with respect to the gas concerned, it is desirable to make the membranes as thin as possible. Thin metallic films can be produced in a number of well known manners, such as for example sputtering, depositing metal vapor and chemical depositing methods. For mechanical stability such thin films must lie on a mechanically stable, supporting substrate. When employed as membranes for selective separation of gases, the thin metal membrane lies on a supporting substrate having a sufficient permeability for the gas component with respect to which the metal membrane is selective. Supporting porous substrates must have as small pores as possible in order to have the required mechanical strength for the thin metal membrane it supports. Tight substrates must have a high permeability for the gas concerned, and hydrogen is particularly interesting here. This is known in various metals, inter alia, in group V of the periodical system. Previously there have been proposed methods for producing thin (<25 $\mu$m) defect-free metallic membranes by sputtering or thermal or chemical depositing on the substrate, i.e. the metal membrane is formed by letting it grow on the substrate until it has the thickness being necessary in order not to contain defects in the form of through holes or cracks. In actual practice it has been found to be difficult to manufacture very thin (<2 $\mu$m) defect-free membranes on substrates by means of these methods. These known techniques are described, inter alia, in:

1. Japanese patent publication 4-349926 (A)—patent application No. 3-126105—"Hydrogen gas separation membrane"—Mitsubishi Heavy Ind. Ltd.
2. V. M. Gryaznow, O. S. Serebryannikova, Yu. M. Serov, M. M. Ermilova, A. N. Karavanov, A. P. Mischenko and N. M. Orekhova: "Preparation and catalysis over palladium composite membranes". Applied Catalysts A: General, 96 (1993) 15–23.
3. U.S. Pat. No. 4,857,080 describes the preparation of composite membranes by direct sputtering on a supporting, porous substrate.
4. U.S. Pat. No. 5,409,782 corresponds to some degree to the US patent just referred to, in so far as it relates to methods for forming thin films directly on a substrate.
5. U.S. Pat. No. 4,699,637 describes: First there is prepared a metal membrane of thickness 10–100 microns, this being then put between two metal fabrics for mechanical strength. The actual membrane manufacturing takes place by rolling.

In an other method there has been employed thicker (25 $\mu$m) Pd films being thereafter laid on tight substrates of a metal having a high hydrogen permeability, such as vanadium metal. In order to avoid interdiffusion between the Pd film and the metal substrate, there must be applied a thin oxide layer being porous and having a certain roughness. This method is described in:

6. D. I. Edlund and W. A. Pledger I. Membrane Science 77 (1993) 255–264
7. U.S. Pat. No. 5,139,541 (D. I. Edlund 1992).

Other somewhat remote examples of prior art in this context may be found in U.S. Pat. No. 3,270,381, 4,898,623 and 5,382,344.

SUMMARY OF THE INVENTION

With this invention there has been provided an alternative and novel method of manufacturing a composite membrane structure comprising a very thin metal membrane, for example of silver, palladium or palladium alloys, for use in selective diffusion of gases. In this novel method there is employed a base member having a tight surface and a very low roughness, for example a surface of a highly polished silicium monocrystal, for depositing the thin metal membrane. The surface roughness being a prerequisite according to the invention, can be defined advantageously in relation to the thickness of the metal membrane to be deposited. It is preferred that the thickness of the membrane is several times larger than the irregularities that represent the surface roughness. More particularly the irregularities expressed as depth/height dimension in the surface of the base member, should as a maximum be one third to one half of the thickness of the metal membrane to be manufactured.

The very regular or smooth surface makes it possible to prepare very thin membrane films that are free of defects. The actual depositing of the metal film on this particular base member can be performed by means of sputtering methods or vaporazing methods, or a combination of these. Under proper conditions this metal film (membrane) can be removed from the base member and applied to the desired supporting substrate. The metal film is removed mechanically from the base member used, by being pulled therefrom.

In order that the metal film can be easily removed from the base member it is a substantial advantage that this consists of a material resulting in low adherence of the metal film applied. Examples of materials having suitable adherence properties in this respect, are, inter alia, glass, most oxides and nitrides. More specifically silicium nitride is a base member material having low adherence. The same applies to alumina where bound oxygen against the metal film applied, for example of palladium, is believed to be the cause of the desired low adherence. Correspondingly also borides and carbides and so forth are considered to be suitable, since all such materials have a tendency to form a mono-layer having a high oxygen content on the surface, when located in air.

It is the preparation of the membrane on a smooth, defect-free base member, the subsequent mechanical removal from the base member without forming any defects in the metal membrane, and afterwards the application thereof to a supporting substrate, that in summary constitute the basic features of the invention.

More definite statements of the method according to the invention as well as the novel and specific features thereof, are contained in the claims.

As another example of base material in addition to silicium, preferably in a mono-crystaline form as mentioned above, quartz is a material of interest in this context. It is difficult to give any dimensional indication of the roughness of useful regular or smooth base members as mentioned above, this being among other things due to the fact that it has little meaning to talk about "roughness" when being at an atomic level. This is the case when employing a silicium monocrystal as a base member for manufacturing a palladium membrane. It is essential that the base member has a very regular surface so that a defect-free membrane can be formed thereon while at the same time it shall be possible to separate the membrane coating from the base member. A consideration of much significance in the choice of base material, is that this should have a low chemical activity with respect to the metal concerned in the membrane to be manufactured, for example palladium.

So as to simplify the process of removing the metal membrane from the base member, this can be pre-treated so that the metal will more easily losen from the base member. This is known per se and is done by applying an ultra thin film to the base member for reducing the adherence between the metal membrane and the base member. This ultra thin film preferably has a thickness being several orders of magnitude lower than the thickness of the membrane coating on the base member, such as less than 1/1000 of the thickness of the coat. The film applied can for example consist of silanes. With such a thin film applied, the surface on which the membrane coating is to be deposited, will be at least as good or perfect as the actual base member, the surface of which in this way can be regarded as modified and as the case may be will remain so modified or treated during the course of the manufacturing process throughout a certain time. At this point it should be mentioned that the oxide being formed naturally on a silicium surface at a thickness of for example 12–20Å may be able to represent such a modification or surface treatment involving poor adherence of an applied membrane or metal coating.

As an alternative to or in combination with pre-treatment as discussed above, there may also be performed a post-treatment of the applied membrane coating, by chemical, thermal or mechanical methods in order to reduce the adherence between the base member and the coating. Both pre-treatment and post-treatment as mentioned here, are in principle known from other uses.

The invention involves a number of advantages, in particular the following:

1. Very thin, defect-free, homogeneous membranes (thickness typically 10,000 Å) combined with a porous substrate, can be manufactured. The reason for this is that the surface of the base member on which the membrane is formed, can easily be kept clean of particles, and that the depositing process itself involves a high degree of purity.

2. The composition of the membrane can be simply controlled and varied when it is applied by means of a sputtering process. The method is very well reproducible.

3. An automated manufacturing process is possible and may be performed in the same way as for example in the production of video tape. It is an advantage to apply the metal membrane on a movable base member, and then continuously pull it off later and collect it, for example in the form of a metal coil. The thickness of the membrane makes it possible to have a continuous, automated production at low material and manufacturing costs.

4. The method is flexible with respect to how the metal membrane is employed. After having pulled the metal membrane off the base member one is free to select a substrate for the membrane. Therefore it is possible to manufacture assembled "composite" membranes with a very thin metal membrane lying on a porous or less smooth, supporting substrate.

5. The method also makes it possible to control the strength of the contact between the metal membrane and the substrate it is laid on, by the ability to control the degree of joining.

BRIEF DESCRIPTION OF THE DRAWING

These and other features and advantages of the invention are more fully disclosed in the following detailed description of the preferred embodiments of the invention, which are to be considered together with the accompanying drawing wherein like numbers refer to like parts and further wherein.

Figure 1:
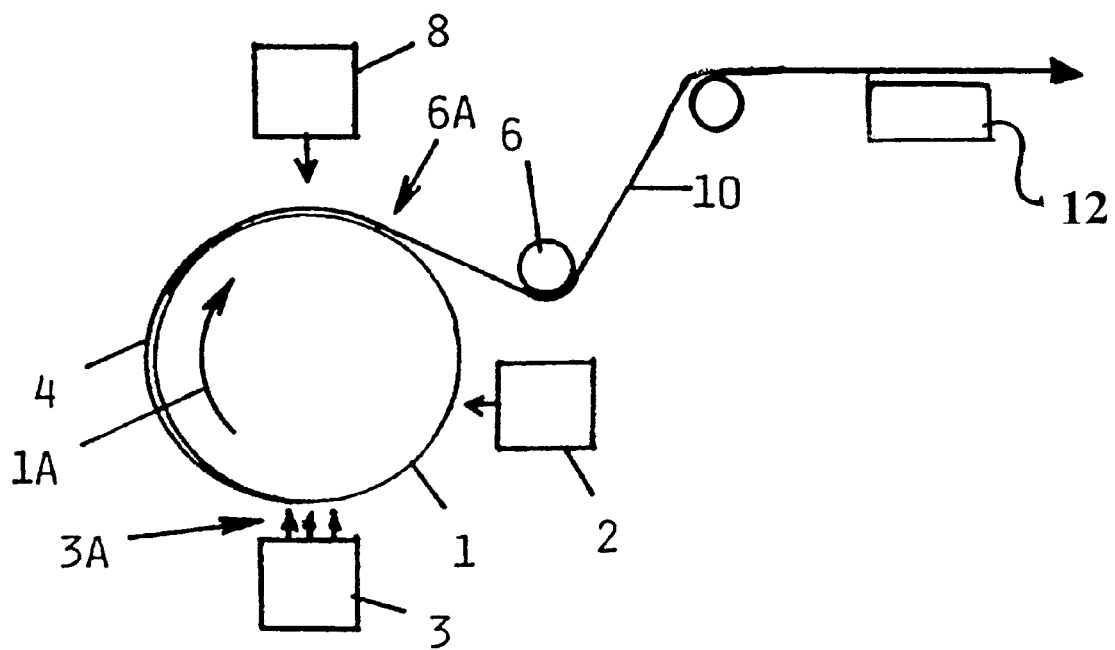
FIG. 1 is a schematic view of a preferred embodiment of the method according to the present invention.

In the following description the invention is to be explained more closely in the form of an example based on the method according to the invention.

FIG. 1 in a simplified and schematic manner shows a plant or equipment comprising a rotating base member in the form of a cylinder 1, the direction of rotation of which is indicated with arrow 1A. A deposition device 3 based for example on sputtering according to principles being known per se, as illustrated with arrows 3A applies a coating to the rotating, cylindrical base member 1, whereby the coating is shown at 4. This membrane coating follows the rotation of cylinder 1 through a certain angular range and is influenced by a post-treatment device 8 in a chemical, thermal or mechanical way so as to reduce the adherence between the base 1 and coating 4. Then at position 6A the resulting membrane is removed from the cylinder surface 1 by being pulled out via an auxiliary roller 6 to a continuous membrane foil 10 for further processing. There is also shown a pre-treatment unit 2 which can apply for example an ultra thin film as explained previously, by chemical, thermal or mechanical means prior to the sputtering or vapor depositing by means of device 3. Such pre-treatment shall serve to reduce the adherence between base 1 and coating 4 being applied thereto.

It is obvious that the production can take place in other manners than continuously by means of a rotating base member 1 as illustrated in FIG. 1. As an alternative the membrane can be produced in sheets on a preferably planar base member having a desired area dimension, and the removal from such a stationary base member can take place for example by means of a piece of tape being brought to adhere at an edge of the membrane produced, so that it can be pulled out from or up from this edge.

The composition of the membrane coating being built up on the base member, can be controlled or checked and moreover it is possible to build up the coating layer by layer with varying composition or properties in the layers. This latter possibility can for example be of significance if a membrane is desired with a certain catalytic surface effect or a specific chemical property, such as corrosion resistance.

The production equipment with a rotating cylinder as shown in FIG. 1, can be based on per se known production plants for similar purposes, for example video tape as previously mentioned, but modified with respect to the steps included in the method according to the invention. This in particular applies to the surface of the base member or cylinder 1, which preferably has specific properties, i.e. very low surface roughness and low adherence to the material applied, as explained above. How the metal membrane is mounted on and attached to a supporting substrate 12, is explained in the following examples.

Two exemplary uses of interest to metal membranes manufactured according to the invention, are now explained below.

EXAMPLE 1

Palladium and Palladium Alloys for Hydrogen Separation

The development of palladium alloys for hydrogen separation has lasted for many years. The major part of this work has been directed towards thick, self-supporting metal foils (>25 $\mu$m) being commonly manufactured by rolling. Because the material costs are very high for palladium membranes it has been attempted in recent years to manufacture thinner membranes being carried by a porous substrate of another, cheaper material. Such membranes are denoted composite membranes, and are manufactured by chemical or thermal deposition and sputtering techniques directly onto the supporting substrate 12. It has proved to be difficult to manufacture such metal membranes without defects when they shall be thinner than 2 $\mu$m. This can be due to the natural porosity of the substrate and the stresses established in the metal when it is applied to the irregular surface that such a substrate has.

By means of the present method the palladium alloy can be used for making a defect-free membrane or film having a thickness less than 2 $\mu$m, at a regular and smooth base member. Then the metal film is pulled off from this base and is laid on a porous, supporting substrate 12. If the substrate 12 is a ceramic, porous material that can be employed at a high temperature, there is provided thereby a composite membrane for high temperature use. The membrane can be mechanically attached to the substrate 12 by heat-treatment so that it sags and is shaped according to the irregularities in the substrate surface, or this reacts with the membrane, or the membrane can possibly be glued to the substrate 12 with a suitable adhesive along or at points of the periphery of the metal membrane.

A possibility of controlling the contact between the membrane and the substrate 12 can be favourable in view of an equal heat expansion of the two materials. Improved chemical or physical contact between the metal film and the porous substrate 12, can be obtained by using various forms of adhesive at limited areas of the substrate 12, or by chemically impregnating the substrate or the substrate surface, with a component increasing the contact during subsequent heat-treatment, as for example Pd-impregnation of the substrate.

EXAMPLE 2

Palladium or palladium alloys as electrodes for hydrogen-conductive electrolytes, or silver as electrodes for oxygen-conductive electrolytes in electrochemical cells as for example fuel cells and gas sensors.

As an example there may here be contemplated a fuel cell consisting of an ion-conductive electrolyte, for example an oxygen ion conductive electrolyte such as yttrium-stabilized zirconium or a hydrogen-conductive electrolyte as for example Yb-doped $BaCeO_3$ or $SrCeO_3$.

At both sides of the electrolyte there is placed an electrode which must be able to conduct electrons and be penetrable to gas. A thin metallic film of silver as a cathode on an oxygen ion conductive electrolyte, will be suitable as electrode. Correspondingly a thin palladium-based metallic film at the anode side, will be suitable as electrode in such fuel cells. In a similar way metal membranes produced according to the invention, can be electrodes in gas sensors for measuring chemical potential differences by means of EMF.

EXAMPLE 3

Selective Metallic Membranes as a Part of Sensor Components

Selective metal membranes can be incorporated in sensors for detecting the gases diffusing selectively through the metal film. In a gas flow containing a mixture of several gases a metal membrane being selective, for example with respect to hydrogen, can be employed for extracting hydrogen to be detected in a chemical analysis. If the diffusion coefficient of the gas in the metal membrane and the support is known, it is possible to calculate the amount of hydrogen in the gas mixture. In this manner it will be possible to obtain both detection and a quantitative description of hydrogen in the gas mixture.

The invention described here makes it possible to produce defect-free metal films or membranes (i.e. without any through holes) combined with a supporting substrate for gas separation, by employing a method whereby the metal film is first formed on a particular base member and is afterwards mechanically pulled off therefrom without creating any defects. By using a well suited and preferably perfect base member during deposition of the metal by sputtering and/or a vaporizing process, thinner films can be prepared than by means of known methods, whereby the metal membrane is prepared directly on the porous or in other respects irregular, supporting substrate.

For the purpose of for example an increased production capacity or specific qualities, two or more of the deposition techniques mentioned, apparently can be combined in the same process, for example sputtering and vapor deposition. In such case sputtering will normally be performed prior to the vapor step. Moreover the shape of the base member can be modified in relation to the cylindrical shape illustrated and the planar shape mentioned, in the case of specific desires or needs concerning the geometrical shape of the metal membrane to be manufactured. Thus, the subsequent practical utilisation or adoption of the membrane can take place more easily.

In addition to the possibilities of use mentioned, it is obvious that also other fields of use can be found. In connection with the production of a number of chemical compounds dehydrogenation or hydrogenation can be of interest, and selective gas separation by means of membranes produced according to the present invention can be well suited also for such uses.

As a supporting substrate in a composite membrane structure there can be employed plastic materials, metals, ceramic materials and so forth. Also in this respect it is possible to select materials within a wide spectrum.

What is claimed is:

1. Method for manufacturing a composite membrane structure comprising a thin metal membrane for use in selective diffusion of gases, said method comprising:

depositing a metal material for the membrane, by sputtering deposition, as a coating on a base member having a low surface roughness, and to a thickness of about 10,000 angstroms:

pulling said coating off the base member so as to form the metal membrane; and placing the metal membrane onto a supporting substrate.

2. Method according to claim 1 wherein the base member is pre-treated chemically, thermally or mechanically prior to the sputtering deposition so as to reduce the adherence between the base member and the coating.

3. Method according to claim 2 wherein the base member is pre-treated by applying an ultra thin film the thickness of which is less than 1/1000 of the thickness of the coating.

4. Method according to claim 1 wherein the base member and the coating are post-treated chemically, thermally or mechanically so as to reduce the adherence between the base member and the coating.

5. Method according to claim 1 comprising a base member formed of monocrystaline silicium.

6. Method according to claim 1 comprising a base member consisting essentially of one of glass and quartz.

7. Method according to claim 1 wherein the surface roughness of the base member is a fraction of the thickness of the coating forming the metal membrane.

8. Method according to claim 1 wherein the base member is moved continuously so that the metal material is continuously applied to the base member at a first position, and so that the resulting coating is pulled off from the base member at a second position.

9. Method according to claim 8 wherein the base member comprises a circular cylindrical shape, and the base member is driven in rotational movement.

10. Method according to claim 1 wherein the sputtered coating is built up in a plurality of individual layers wherein each of said layers comprises a varying composition.

11. Method according to claim 1 wherein the metal membrane is attached to the supporting substrate only at separate points along the edges of the metal membrane.

12. A Method for manufacturing a composite membrane comprising:

providing a base member having a low surface roughness;

providing a support substrate;

sputtering a thin coating of metal onto said base member;

pulling said thin coating of metal off of said base member thereby forming a membrane of said metal; and placing said metal membrane onto said supporting substrate.

13. A method according to claim 12 comprising:

pretreating said base member chemically, thermally or mechanically prior to said sputtering so as to reduce the adherence between said base member and said thin metal coating.

14. A method according to claim 13 wherein said pre-treating comprises applying a film the thickness of which is less than 1/1000 of the thickness of said metal coating.

15. A method according to claim 12 comprising post-treating said metal coating chemically, thermally or mechanically so as to reduce the adherence of said metal coating to said base member.

16. A method according to claim 12 comprising:

providing said base member in a form of a monocrystaline silicium base member.

17. A method according to claim 12 comprising:

providing said base member in a form of a silicon dioxide base member.

18. A method according to claim 12 comprising:

providing said base member with a surface roughness that is a fraction of a thickness of said coating forming said metal membrane.

19. A Method for manufacturing a composite membrane comprising:

providing a continuous base member having a low surface roughness and a plurality of support substrates;

sputtering a thin coating of metal onto said base member;

moving said base member continuously relative to said sputtered metal so that said thin coating of metal is continuously applied to said base member at a first position; and pulling a continuous membrane formed from said thin coating of metal off of said base member; and placing at least a portion of said metal membrane onto at least one of said plurality of supporting substrates.

20. A method according to claim 19 comprising:

pretreating said continuous base member by applying a film the thickness of which is less than 1/1000 of the thickness of said metal coating prior to said sputtering so as to reduce the adherence between said surface of said continuous base member and said thin metal coating wherein said pre-treating comprises.

21. A Method for manufacturing a composite membrane comprising:

providing a base member having a low surface roughness;

providing a support substrate;

sputtering a coating of metal selected from the group consisting of silver, palladium or palladium alloys onto said base member to a thickness of about 10,000 angstroms;

pulling said coating of metal off of said base member thereby forming a defect free membrane of said metal; and placing said metal membrane onto said supporting substrate.

* * * * *